United States Patent [19]

Natusch et al.

[11] Patent Number: 4,791,552

[45] Date of Patent: Dec. 13, 1988

[54] APPARATUS AND METHOD FOR ADDRESSING SEMICONDUCTOR ARRAYS IN A MAIN MEMORY UNIT ON CONSECUTIVE SYSTEM CLOCK CYCLES

[75] Inventors: Paul J. Natusch, Westford; David C. Senerchia, Shrewbury; John F. Henry, Jr., deceased, late of Townsend, all of Mass., by Beverly A. Henry, administratrix

[73] Assignee: Digital Equipment Corporation, Maynard, Mass.

[21] Appl. No.: 823,951

[22] Filed: Jan. 29, 1986

[51] Int. Cl.$^4$ ............................................. G06F 12/00
[52] U.S. Cl. .................................................... 364/200
[58] Field of Search ... 364/200 MS File, 900 MS File; 365/233, 231; 307/590, 591, 593, 595, 597, 600, 601, 602

[56] References Cited

U.S. PATENT DOCUMENTS

| | | |
|---|---|---|
| 3,919,692 | 11/1975 | Kronies et al. |
| 3,931,613 | 1/1976 | Gruner et al. .................. 340/172.5 |
| 4,050,059 | 9/1977 | Williams et al. .................... 364/200 |
| 4,287,563 | 9/1981 | Houston, Jr. |
| 4,378,589 | 3/1983 | Finnegan et al. |
| 4,393,461 | 7/1983 | Holtey et al. ........................ 364/900 |
| 4,435,757 | 3/1984 | Pross, Jr. |
| 4,631,659 | 12/1986 | Hayn, II et al. |

FOREIGN PATENT DOCUMENTS 0165822 12/1985 European Pat. Off.

OTHER PUBLICATIONS

IBM Technical Disclosure Bulletin, vol. 28, No. 5, Oct. 1985, (New York, USA), "Memory Interleave with Minimum Signal Lines", pp. 2049-2050.

Primary Examiner—Gareth D. Shaw
Assistant Examiner—Jonathan C. Fairbanks
Attorney, Agent, or Firm—Finnegan, Henderson, Farabow, Garrett and Dunner

[57] ABSTRACT

Apparatus is disclosed for selecting a group of address signals to be applied to a memory unit array and for applying the address signals to the memory unit array to permit the activity associated with the address signals to be completed. The apparatus generates a multiplicity of signals controlling a latch-type buffer storage unit. The first generated signal insures that the signal controlling the buffer storage unit is active during application of the address signals to the system bus. The second generated signal overlaps the first generated signal and extends the signal controlling the buffer storage unit a small amount. The third generated signal overlaps the second generated signal and extends the signal controlling the buffer storage unit for the period of time necessary to utilize the memory unit array.

9 Claims, 4 Drawing Sheets

APPARATUS AND METHOD FOR ADDRESSING SEMICONDUCTOR ARRAYS IN A MAIN MEMORY UNIT ON CONSECUTIVE SYSTEM CLOCK CYCLES

RELATED APPLICATIONS

This application is related to the following patent applications, all of which are filed in the U.S. Patent and Trademark Office on the filing date of the present patent application.

APPARATUS AND METHOD FOR PROVIDING DISTRIBUTED CONTROL IN A MAIN MEMORY UNIT OF A DATA PROCESSING SYSTEM; U.S. patent application Ser. No. 823,687; filed Jan. 29, 1986: by Paul J. Natusch; Eugene L. Yu; David C. Senerchia; and Beverly A. Henry as Administratrix of the Estate of John F. Henry, Jr., Deceased.

APPARATUS AND METHOD FOR INCREASED SYSTEM BUS UTILIZATION IN A DATA PROCESSING SYSTEM; U.S. patent application Ser. No. 823,801; filed Jan. 29, 1986: by Paul J. Natusch; David C. Senerchia; and Beverly A. Henry as Administratrix of the Estate of John F. Henry, Jr., Deceased.

APPARATUS AND METHOD FOR RESPONDING TO AN ABORTED SIGNAL EXCHANGE BETWEEN SUBSYSTEMS IN A DATA PROCESSING SYSTEM; U.S. patent application Ser. No. 823,775; filed Jan. 29, 1986: by Robert E. Stewart; James B. Keller; Paul J. Natusch; Eugene L. Yu; and Beverly A. Henry as Administratrix of the Estate of John F. Henry, Jr., Deceased.

BACKGROUND OF THE INVENTION

1. Field of the Invention

This invention relates generally to data processing systems and, more particularly, to the memory unit arrays storing groups of logic signals. The memory unit arrays are typically implemented using transistor-transistor logic (TTL). Thus, the processing of logic signal groups is substantially slower than the processing in the remainder of the data processing system. In particular, while it would be desirable to address a different memory unit array on each system clock cycle, the address for any logic signal group must be applied to a memory unit array for a substantially longer period than a single system clock cycle.

2. Description of the Related Art

Referring to FIG. 1, a typical data processing system is shown. The illustrated data processing system includes central processing units 10 and 11, input/output units 13 and 14, a main memory unit 15 and a system bus 19 coupling together the central processing, input/output, and main memory units of the data processing system. The central processing unit 10 or 11 processes groups of logic signals according to software and/or firmware instructions. The logic signal groups to be processed, as well as a majority of the programs to be executed, are typically stored in the main memory unit 15. A console unit 12 can be coupled to the central processing units and includes apparatus and stored instructions to initialize the system. The console unit 12 can act as a terminal during the operation of the data processing system. The input/output units provide an interface to the remainder of the data processing system components such as terminal units, mass storage units, communication units, and any other units to be coupled to the data processing system. The detailed function of the units coupled to the system bus 19 is less important to an understanding of the present invention than the fact that these units operate autonomously and communicate with the remainder of the data processing system units or subsystems by means of the system bus.

Referring next to FIG. 2, a block diagram of a typical main memory unit 15 found in the related art is shown. The main memory unit 15 includes a memory interface unit 21 that exchanges signals with the system bus 19. The memory interface unit is coupled to a memory unit bus 22 and the memory unit bus 22 has at least one memory array unit 23 coupled thereto. The memory array units 23 each comprise a plurality of logic signal storage elements organized in groups so that each group of storage elements can be accessed by a unique logic signal group address. The memory interface unit 21 includes the apparatus for controlling the exchange of logic signal groups, identified by logic signal group addresses, between the memory array units 23 and the system bus 19. The memory interface unit 21 includes apparatus for identifying activity on the system bus 19 directed to the memory unit 15, as well as apparatus for returning logic signal groups to the subsystems for the data processing units which had requested specific signal groups from main memory. Buffering of the logic signal groups, error correction and generation of control signals are also typically performed in the memory interface unit 21.

The foregoing conventional main memory architecture limits the amount of activity that can be performed in the main memory unit 15. Specifically, because all the activity must be performed under the control of a memory interface unit 21 control unit, only a single activity may be performed at a time. A need has therefore arisen for apparatus and methods of operation for a main memory unit that can permit a multiplicity of simultaneous operations involving that main memory unit. This requirement is particularly stringent in the computer systems referred to as "write through" data processing systems in which a logic signal group from the data processing system is immediately stored or written into the main memory unit. The memory activity resulting from write through data processing system can result in performance deterioration unless the main memory unit can be modified in a manner to accommodate the increased activity.

SUMMARY OF THE INVENTION

It is an object of the present invention to provide an improved data processing system.

It is a further object of the present invention to provide an improved main memory unit for a data processing system.

It is yet another object of the present invention to provide a plurality of memory array unit in a main memory unit, with each array capable of functioning independently of the other memory array units.

It is a still further object of the present invention to provide an array unit bus, wherein a plurality of memory array units are coupled to the array unit bus and wherein an interface unit couples the array unit bus with the system bus.

It is yet another object of the present invention to provide for apparatus that can permit an address signal group to be applied to an associated group of memory array units for multiple system clock cycles without prolonging the period for which the address signal group must be applied to the main memory unit 15.

The aforementioned and other objects are accomplished, according to the present invention, by providing a main memory unit that includes apparatus associated with each memory array unit for lengthening the time that an address signal group is applied to the address input terminals of a memory array unit. A latch-type buffer storage unit is coupled between the array bus, to which the signals are applied, and the memory array unit input terminals. The buffer storage unit is controlled by an input signal that results from using a logic AND gate to combine an array clock signal, a short latch signal and a long latch signal. The state of all three signals insures that the latch-type buffer storage unit will be transparent when the address signal group is valid and an enable signal of the present invention is applied to the latch-type storage unit. The array clock signal insures that the buffer storage unit can receive the address signal groups applied from the array bus to the buffer storage unit. The array clock signal initially causes the latch of the buffer storage unit to be closed. The short latch signal insures that the output signals of the buffer storage unit (the signals from the array bus) overlap the array clock signal, but extend beyond the period defined by the clock signal. Finally, the long latch signal overlaps the presence of the short latch signal, but extends the latching of the signals of the buffer storage unit for a sufficient length of time to ensure that the address signals are applied to the memory array unit for sufficient time to permit the requisite activity to take place. Three signals are required because the signals used to latch the buffer storage unit are derived from the same clock cycle as the address signals to be applied to the memory array unit terminal. The uncertainties (or skew) that result when additional logic is used to implement the required latching functionality with fewer than three signals will either be too short in duration or will not provide a continuous latching signal to the buffer storage unit.

These and other features of the present invention will be understood upon reading of the following description along with the drawings.

DETAILED DESCRIPTION OF THE PREFERRED EMBODIMENT

1. Detailed Description of the Figures

Figure 1:
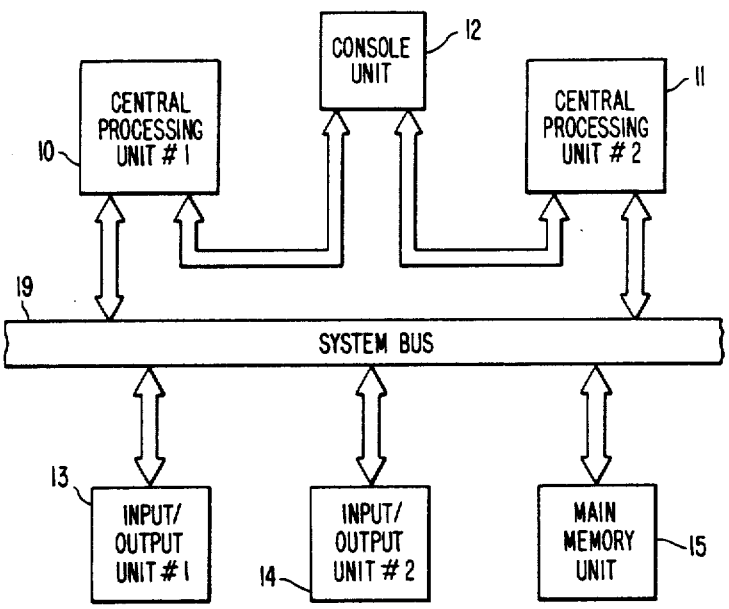
FIG. 1 is a block diagram of the components of a data processing system capable of utilizing the present invention.
Figure 2:
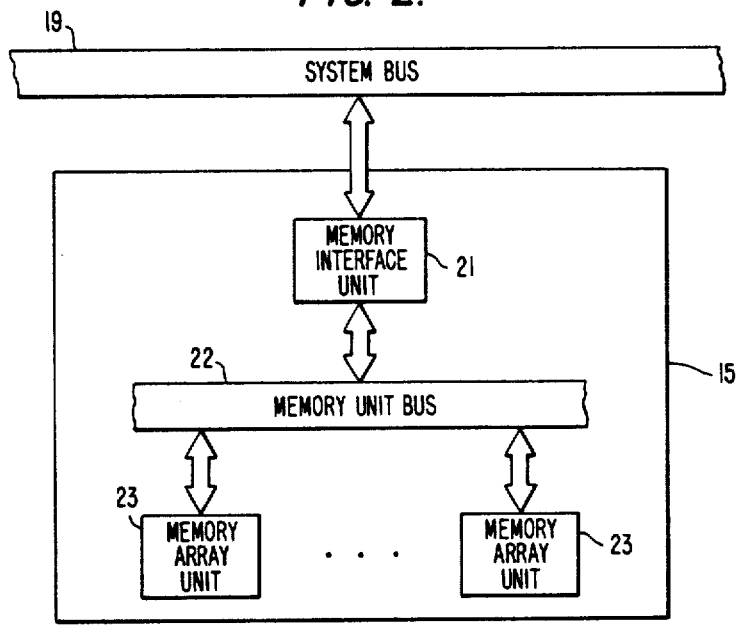
FIG. 2 is a block diagram of a main memory unit typically employed in data processing systems.

FIG. 1 and FIG. 2 have been previously described with reference to data processing systems generally.

Figure 3:
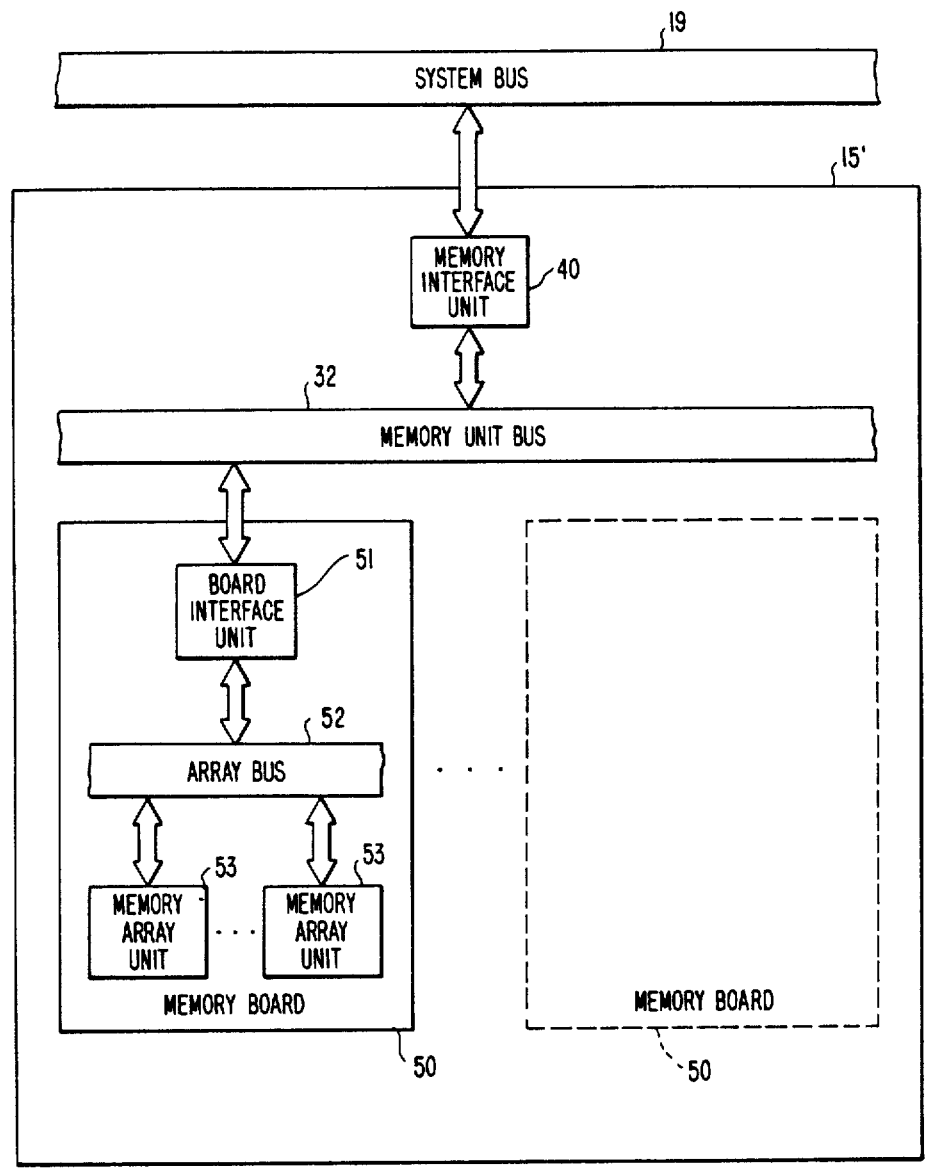
FIG. 3 is a block diagram of a main memory unit according to the present invention.

Referring next to FIG. 3, the basic structure of a main memory unit 15' according to the present invention, is shown. The main memory unit 15' includes a memory interface unit 40 that couples the main memory unit 15' to the system bus 19. The memory interface unit 40 is coupled to, and exchanges signals with, the memory unit bus 32. The memory unit bus 32, in turn, exchanges logic signal groups with a plurality of memory boards 50. The memory boards 50 each include a board interface unit 51 that exchanges logic signals with the memory unit bus 32. The board interface unit 51, in turn, exchanges logic signal groups with array bus 52, while a plurality of memory array units 53 are coupled to the array bus 52.

Figure 4:
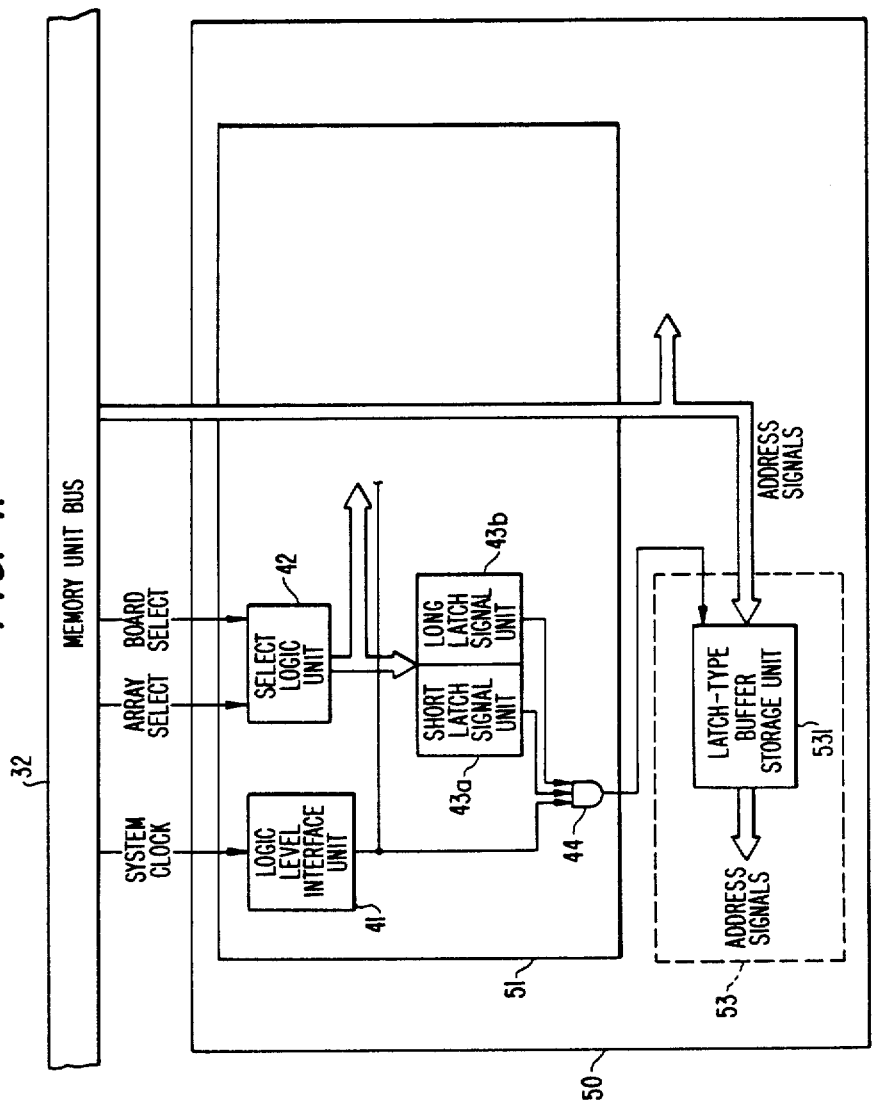
FIG. 4 is a block diagram of apparatus associated with the memory array units that can provide for application of an address for a logic signal group to a different memory array unit each system clock cycle.
Figure 5:
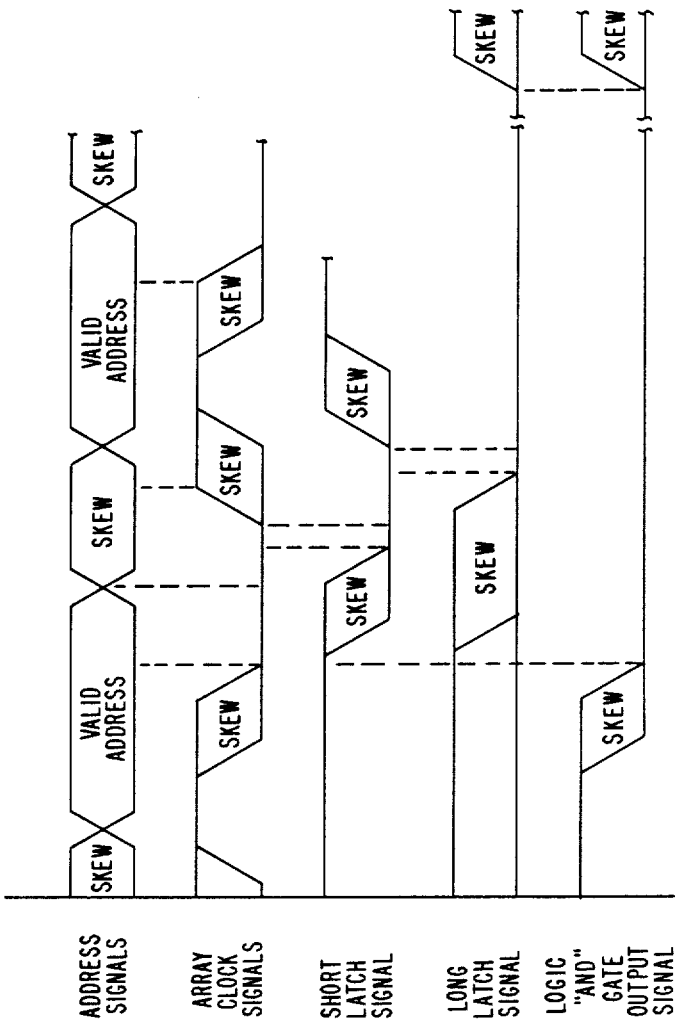
FIG. 5 is a timing diagram of the signals generated to insure that the address signals are applied to the memory unit array for sufficient time to provide accurate access to the associated location in the array.

Referring next to FIG. 4, each memory array unit 53 is shown to include a latch-type buffer storage unit 531. The apparatus for producing the three signals required to latch the buffer storage unit 531 of memory array 53 for sufficient time to permit the correct operation of the memory array units is also shown in FIG. 4. The board interface unit 51 has System Clock signals, Board Select signals and Array Select signals applied thereto from memory unit bus 32. The System Clock signals are used to synchronize the electronic components of the remainder of the data processing system, but must be modified for use with the memory array units 53 and associated logic circuits. The System Clock signals are appropriate for emitter-coupled logic (ECL). The logic signals for application to the ECL components must be modified for application to the components of the memory array units which are implemented in slower transistor-transistor logic (TTL). As is illustrated in FIG. 5, the modification of the signals and the logic operations on the signals, because of the logic elements involved in the modification, introduces uncertainty (skew) in the beginning and trailing edges of changes in the logic signal state. In logic level interface unit 41, the System Clock signals are converted to clock signals compatible with the memory array unit technology. They are then applied to a plurality of logic AND gates, one of which is shown in FIG. 4 as logic AND gate 44. The board interface unit 51 has one logic AND gate for memory array unit on memory board 50.

The Board Select and Array Select signals are applied to the memory board 50. The Board Select signals enable the particular memory board 50 that includes the memory array unit 53 to which the address signals are to be applied. The Array Select signals identify the particular memory array unit 53 on the memory board 50 to which the address signals are to be applied. The Board Select signals and the Array Select signals are typically derived from the complete address signal group, with fields of the complete address signal group being used to designate a physical location of a memory array unit 53. The Array Select signals and the Board Select signals are combined by select logic unit 42 to provide an array enable signal for each memory array unit 53 of the board when that memory array unit 53 is to be addressed. This array enable output signal of select logic unit 42 is then applied to latch signal unit 43. Latch signal unit 43 is divided into two groups of logic elements, short latch signal unit 43a providing a short latch signal and long latch unit 43b providing a long latch signal. The long latch signal, the short latch signal and the array clock signal from logic level interface unit 41 are each applied to input terminals of the logic AND gate 44 associated with the selected array unit 53. The output signal of logic AND gate 44 is applied to the control terminal of latch-type buffer storage unit 531. The address signals, stored temporarily (or latched) in buffer storage unit 531, are applied to the address input terminals of memory unit storage array 53 as long as the output signal of logic AND gate 44 is in a low state, as shown in FIG. 5.

Referring to FIG. 5, the signals applied to logic AND gate 44 and the signals applied to the latch-type buffer storage unit 531 are illustrated. The address signals on the array bus 52 are illustrated by the top wave form of the FIG. 5. In this waveform and in the remaining waveforms, the uncertainty or skew in the logic signal transitions is illustrated and labelled. The array clock circuit signal is illustrated by the next waveform, while the short latch signal is illustrated by the following waveform. Next, the long latch signal is illustrated, while the final waveform illustrates the output signal of the logic AND gate 44, the signal controlling the application of the address signals to the address input terminals of the memory array unit 53.

2. Operation of the Preferred Embodiment

Referring once again to FIG. 3, the configuration of the memory board 50 as illustrated in FIG. 4 permits the application of one address signal each system clock cycle to a different memory array unit 53. The activity of a memory board 50 typically allows the address signal for an associated memory array unit to be applied to that unit for a multiplicity of clock cycles. The addresses signals on memory bus 32 are arranged so that the next sequential address is assigned to a neighboring array, whereby a series of sequential addresses will address each memory array unit before addressing the same memory array a second time. Thus, by using sequential addresses, a plurality of system clock cycles are available for each memory array unit without generally impacting the performance of the data processing system.

The present invention is used with a main memory unit as illustrated in FIG. 3, wherein address signals can be applied to a system bus every clock cycle. The apparatus described with reference to FIGS. 4 and 5 is arranged to select an appropriate address signal for application to the associated memory array unit every clock cycle, but, once an array is selected, the address signals must be applied to the memory array unit for a successive plurality of system clock cycles, i.e. at least the time required to perform the desired memory operation. In the situation illustrated in FIG. 5, the latching (low) signal from the logic AND gate 44 is implemented so the valid non-skewed portion of the array clock signal (i.e. low) overlaps the valid portion of the address signals applied to each memory array. Therefore, the selected address can be entered into latch-type buffer storage unit 531. In order for the memory operation to occur, a longer interval of time is required than the time the array clock signal is valid. The valid (i.e. low) portion of the short latch signal not only overlaps the valid (low) portion of the array clock signal, but also selects the memory array. Similarly, the valid (i.e. low) portion of the long latch signal overlaps the short latch signal. When these signal overlap conditions are fulfilled, then during a given interval of time, at least one of the array clock, short latch or long latch signals will be low. Thus, the resulting output signal from the logic AND gate 44 associated with the addressed memory array unit will be low and will maintain the buffer storage circuit in a latched condition for that entire given interval of time, which is a sufficient period for operation of the addressed memory array unit to utilize the applied address signal. The reason that, for example, the short latch signal can typically not be used to both provide an overlap of the array clock signal and provide a long period for the latching of the address signals is that the additional logic required to implement the longer active period results in additional uncertainty or skew, resulting in a possible inadvertent removal of the latching of the address signals.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of applicant's general inventive concept.

What is claimed is:

1. An apparatus for addressing memory locations in response to address signals which are maintained on a bus for a limited time, said apparatus comprising:
    a memory unit;
    first means, coupled between said bus and said memory unit, for generating an enable signal during said limited time upon receipt of an address signal from said bus or said memory unit and for maintaining said enable signal beyond said limited time to permit said memory unit to respond to said address signal, said first means including
        a first latch being responsive to said receipt of said address signal to generate a first latch signal lasting for a first period of time, said first latch signal providing at least a first portion of said enable signal and being sufficiently fast to maintain at least some overlap of said first portion with any earlier portion of said enable signal, and
        a second latch being responsive to said first latch signal to generate a second latch signal lasting for a second period of time, said second latch signal providing at least a second portion of said enable signal and being sufficiently fast to maintain at least some overlap with said first portion of said enable signal and being of sufficient duration to assure that said enable signal extends beyond said limited time; and
    second means, having an enable signal input terminal coupled to receive said enable signal from said first means and being coupled between said bus and said memory unit, for receiving and supplying said address signal to said memory unit in response to said receipt of said enable signal and for maintaining said address signal for said memory unit for the duration of said enable signal,
    whereby said address signal is available to said memory unit for a sufficiently long time period to permit operation of said memory unit without maintaining said address signal on said bus for the entire long time period needed for operation of said memory unit.

2. An apparatus of claim 1 wherein said first means further includes third means for converting system clock signals received from said bus to memory clock signals which provide said earlier portion of said enable signal.

3. An apparatus of claim 2 wherein said first means further includes a gate having as inputs said memory clock, first latch and second latch signals, said gate providing said enable signal as an output whenever at least one of said inputs is active.

4. An apparatus of claim 1, 2, or 3 wherein said second latch signal lasts longer than said first latch signal.

5. A method for addressing memory locations in a plurality of memory units comprising the steps of:
   maintaining an address signal for a memory unit on a bus for a limited time;
   generating an enable signal for said memory unit, said enable signal beginning during said limited time;
   maintaining said enable signal for a time period longer than said limited time by the substeps of
   i. generating a first latch signal in response to said address signal,
   ii. generating a second latch signal in response to said first latch signal, said second latch signal becoming active during said first latch signal,
   iii. maintaining said enable signal in response to the presence of either said first or second latch signals, and
   latching said address signal for use by said memory unit during the duration of said enable signal,
   whereby said address signal is available to said memory unit for a sufficiently long time period to permit operation of said memory unit without maintaining the address signal on said bus for the entire long time period needed for said memory unit.

6. A method of claim 5 wherein said step of generating an enable signal includes the substep of initiating said enable signal in response to a system clock signal on said bus.

7. A method of claim 5 or 6 wherein said step of maintaining an address signal comprises the substep of generating a sequence of address signals at least some of which are for additional ones of said memory units, with said address signals in said sequence for said memory unit being separated by periods of time longer than said limited time which each said address signal is maintained on said bus.

8. A method of claim 6 wherein said substep of generating a first latch signal comprises the step of activating said first latch signal before termination of a corresponding one of said system clock signals.

9. A method of claim 5 or 6 wherein said substep of generating a second latch signal includes the step of maintaining said second latch signal for a period of time longer than said limited time.

* * * * *